United States Patent [19]

Faria

[11] Patent Number: 4,646,007
[45] Date of Patent: Feb. 24, 1987

[54] TACHOMETER INDICATOR WITH UNCOMPENSATED MAGNETIC RETURN TO ZERO

[76] Inventor: Thomas G. Faria, 17 Park Dr., Waterford, Conn. 06385

[21] Appl. No.: 715,409

[22] Filed: Mar. 25, 1985

[51] Int. Cl.⁴ ............................................... G01R 1/20
[52] U.S. Cl. ..................... 324/146; 116/297
[58] Field of Search .................. 324/144, 140 R, 146, 324/157, 154 R, 151 R; 116/297

[56] References Cited

U.S. PATENT DOCUMENTS

| | | | |
|---|---|---|---|
| 2,668,945 | 2/1954 | Pfeffer | 324/146 |
| 3,094,659 | 6/1963 | Pfeffer | 324/154 R |
| 3,460,038 | 8/1969 | Ziegler | 324/146 |
| 3,777,265 | 12/1973 | Void | 324/146 |
| 4,090,131 | 5/1978 | Mas | 324/146 |
| 4,197,494 | 4/1980 | Van de Werken | 324/146 |
| 4,492,920 | 1/1985 | Reenstra | 324/146 |

FOREIGN PATENT DOCUMENTS 2102580  2/1983  United Kingdom ............... 324/146

*Primary Examiner*—Reinhard J. Eisenzopf
*Assistant Examiner*—Jose M. Solis
*Attorney, Agent, or Firm*—Hopgood, Calimafde, Kalil, Blaustein & Judlowe

[57] ABSTRACT

The zero position in a sine cosine indicator for a tachometer is determined by a projection on the magnetized rotor arranged to encounter a stop projecting from the enclosing bobbin wall. A weak stationary secondary magnet is located adjacent the rotor with the magnetic axis of the secondary magnet rotated through an angle less than full scale from the magnetic axis of the rotor when the rotor is in the zero position. Alignment and crossover between the two magnetic axes is arranged to occur when the pointer associated with the rotor is approximately at midscale. Consequently any distortion of the scale to either side of the crossover point is in opposite directions and the overall appearance of the scale to the casual observer is linear.

11 Claims, 7 Drawing Figures

TACHOMETER INDICATOR WITH UNCOMPENSATED MAGNETIC RETURN TO ZERO

BACKGROUND OF THE INVENTION

The present invention relates to electrical indicators and particularly to an electrical indicator for use as part of an electrical tachometer.

Tachometers using so-called bi-torque or two coil ratio meters for indication usually remain pointed to the last speed reading at the time the instrument is deenergized. When these instruments are used in an automotive vehicle, the indication remains at the speed of the engine when the ignition is cut. To some users, this gives the impression that there is something wrong with the tachometer. To overcome this problem methods have been sought to return the pointer to zero after power is removed.

In British published patent application No. 2,102,580A, there is disclosed an electrical indicator having a relatively strong single or pair of return magnets that pull the rotor and therefore the pointer to the zero position. However, the strong zero return magnets, absent appropriate compensation, would greatly distort the indicator scale. To avoid this distortion, a compensating winding is added to neutralize the field from the zero return magnets whenever the indicator is engergized.

Based upon direct examination of indicators made by the applicants for the British patent and purportedly in accordance therewith, it has been determined that the strong zero return magnets require approximately 13 ampereturns to balance out the permanent field. Since the strength of the return magnets vary somewhat from specimen to specimen, each individual indicator must have the current through the bucking or compensating winding individually adjusted or calibrated necessitating extra labor in manufacturing.

SUMMARY OF THE INVENTION

With the foregoing in mind, it is an object of the present invention to provide a tachometer indicator having a zero return magnet but no compensating winding.

It is another object of the present invention to provide such indicator with minimal scale distortion in spite of the absence of a compensating winding.

In accordance with one aspect of the present invention there is provided an electrical indicator for providing analog readings as a function of signals furnished to sine and cosine windings, said indicator comprising in combination a permanently magnetized rotor disposed within the confines of a bobbin on and about which are disposed sine and cosine windings, a pointer operatively coupled to said rotor and rotatable with said rotor between a zero position and a maximum indicating position, a mechanical stop constructed and arranged to define said zero position and engage the rotor assembly when said pointer reaches said zero position, and a second permanent magnet having opposite magnetic poles disposed in magnetically coupled relation to said rotor and in fixed position in said indicator, said poles being located relative to said bobbin and rotor for defining a return-to-zero zone equal to approximately one half the full scale of said indicator.

In accordance with a further aspect of the invention the mechanical stop is provided by a projection formed on said rotor, and a stop member carried by said bobbin in the path of said rotor projection as said rotor rotates.

BRIEF DESCRIPTION OF THE DRAWINGS

The invention will be better understood after reading the following detailed description of the presently preferred embodiment thereof with reference to the appended drawings in which.

The same reference numerals are used throughout the drawings to designate the same or similar parts.

DETAILED DESCRIPTION OF THE PRESENTLY PREFERRED EMBODIMENT

Figure 1:
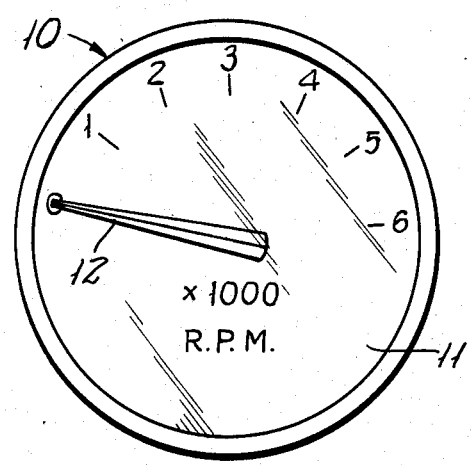
FIG. 1 is a top plan view of the face and dial of an indicator constructed in accordance with the present invention.
Figure 2:
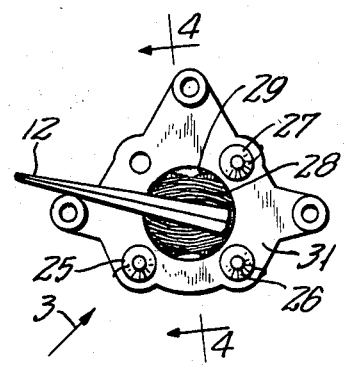
FIG. 2 is a top plan view of the indicator mechanism of FIG. 1, with the bezel, glass and dial face removed.

Referring to the drawings, FIG. 1 shows an indicator 10 with a typical dial face 11 with pointer 12, the dial being calibrated in speed units, e.g., R.P.M., from zero to 6000. The actual range is immaterial, and it can be selected in known manner. The indicator 10 has its pointer 12 positioned at zero, with the indicator deenergized. When energized the pointer 12 will track the vector angle of the field produced by the sine cosine windings. As a tachometer for use with an automotive engine, idling speed is generally well below 3000 R.P.M., the midpoint of the range for this particular indicator. Therefore, when the ignition to such engine is shut off, unless the engine is being operated in an abnormal manner, the tachometer indicator will be pointing to, say, one to two thousand R.P.M., well below mid range, and will be forced to zero when the signal is removed.

Figure 3:
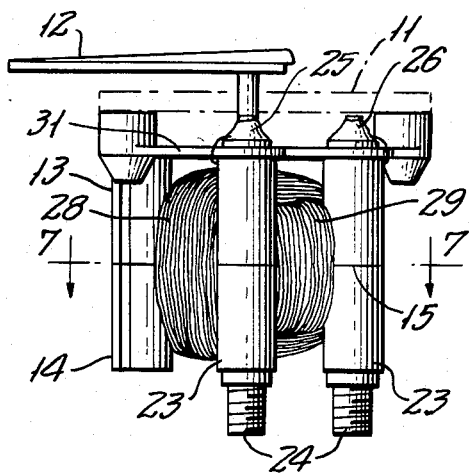
FIG. 3 is an elevational view, slightly enlarged, of the mechanism of FIG. 2 as viewed in the direction of the arrow 3 in FIG. 2.

Referring to the remaining figures of the drawings, it will be seen that the indicator consists of upper and lower bobbin parts, 13 and 14, brought together at a parting line 15 and forming a housing with a right circular cylindrical chamber 16 within which is housed a rotor body 17 mounted on a shaft 18. The shaft 18 is journaled at one end in a bore 19 through the wall 20 of the upper bobbin half 13, and at its other end in a bore 21 in the lower bobbin half 14. The pointer 12 is press fit onto the splined region 22 of the shaft 18. Normally this last step is accomplished after the dial face has been put in place as shown in phantom lines in FIG. 3.

Hollow column members 23 receive threaded binding posts 24, to the upper ends of which are soldered at 25, 26 and 27 the leads (not shown) for the orthogonally related windings 28 and 29. The column members 23 are attached by webs 30 to the cylindrical wall defining the chamber 16. Surmounting the upper bobbin half 13 is a top plate 31 under the heads of the screws constituting the binding posts 24. Both parts of the bobbin, 13 and 14, and the top plate 31 have been molded from glass fibre reinforced Nylon.

Figure 4:
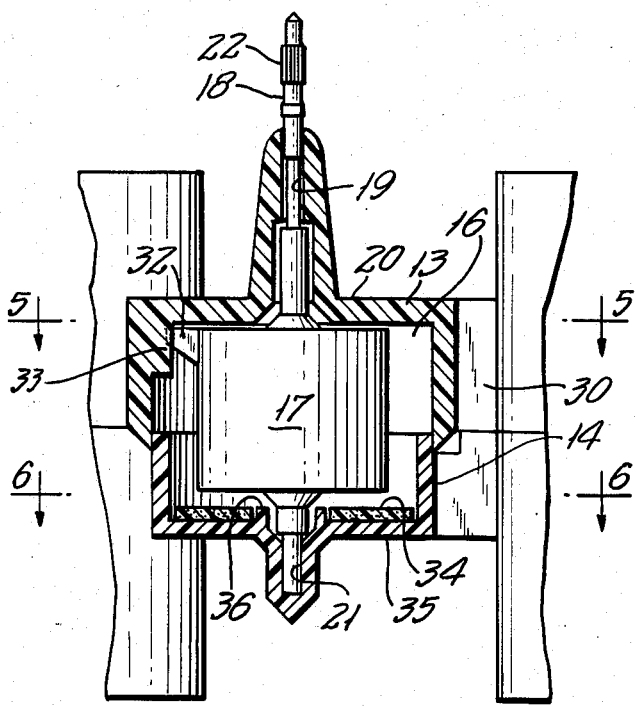
FIG. 4 is an enlarged fragmentary sectional view taken along line 4—4 in FIG. 2 with the rotor present but the windings omitted.
Figure 5:
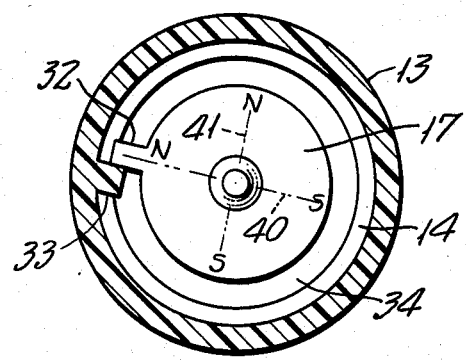
FIG. 5, is a transverse sectional view taken along the line 5—5 in FIG. 4.

The rotor body 17 is preferably molded from a barium ferrite composition and is magnetized along a diametral plane in the diametral direction such as illustrated by the phantom line 40 in FIG. 5. The rotor body 17 has formed integrally therewith a radial projection 32, best seen in FIGS. 4 and 5, for engaging a stop member 33 carried by the bobbin in the upper half 13 in the path of the rotor projection 32 as the rotor 17 rotates. Stop member 33 established the zero position for the pointer 12 when rotating counterclockwise.

Figure 6:
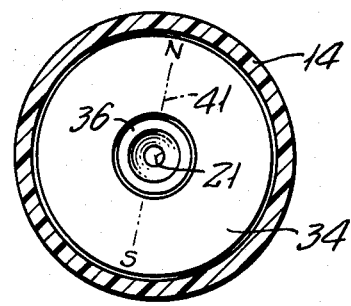
FIG. 6 is a view similar to FIG. 5 taken along the line 6—6 in FIG. 4.
Figure 7:
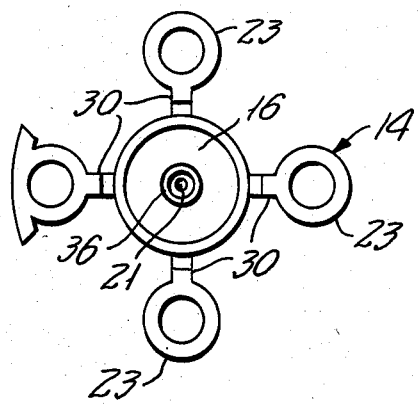
FIG. 7 is a top plan view of one half of the bobbin structure as seen in the direction of the arrows 7—7 in FIG. 3.

For the purpose of urging the rotor 17 and its pointer 12 toward the zero position and against the stop member 33, a washer or wafer 34 of magnetizable material is bonded by a suitable adhesive against the circular end wall 35 of the lower bobbin half 14, best seen in FIG. 4. For the purpose of centering the washer 34 within the chamber 16 there is provided a raised circular lip 36 formed around the mouth of the bore 21 concentric therewith. The washer 34 is formed preferably from a barium ferrite filled nylon with high coercivity but with an effective field strength, when magnetized in a diametral direction, that is relatively weak. The polarization and orientation of the magnetic axis of washer 34 in chamber 16 is preferably as shown by the phantom line 41 in FIGS. 5 and 6 relative to the line of polarization of the rotor 17 and the location of stop member 33. It has been found convenient to install the washer and locate the assembly in a suitable fixture while subjecting the assembly to a strong magnetizing field in the desired direction for the purpose of magnetizing the washer 34.

FIG. 5 illustrates the cooperation of the magnetic field from washer 34 with that of the rotor 17. It will be appreciated that so long as the rotor 17 has not rotated clockwise from the zero position to the point where the magnetic axis of the rotor coincides with and crosses over the magnetic axis of the washer 34, the rotor 17 will be urged back to the zero position when windings 28 and 29 are deenergized. It is preferred that the crossover point coincide with the pointer reaching midscale, notwithstanding the fact that the rotor, if beyond the crossover point when the coils are deenergized, will be driven along with the pointer toward the maximum reading. When the present indicator is used as an automotive engine tachometer, power is usually always removed when the speed is below half range. Therefore, contrary to prior attempts at use of magnetic zeroing devices, the present zeroing magnet has one of its poles located effectively at midscale. This gives rise to several advantages in that: (1) a weaker restoring magnet can be used; and (2) the effect of the restoring magnet on scale linearity is divided equally between the first and second halves of the scale but operating in opposite directions. The net effect is that the distortion is so slight as to be unnoticed by the casual observer.

The windings 28 and 29 have not been discussed except in passing. They can be wound on the bobbin structure in any well known fashion for this type of indicator instrument. Also, the bore 21 in the lower bobbin part 14 can be filled with silicone oil in known manner to provide damping of the rotor motion if desired.

To summarize, the significant relationship is that when the projection 32 on the rotor 17 is against the stop 33, the magnetic axis of the magnet 34 should be rotated from the magnetic axis of the rotor through an arc equal to the desired return-to-zero zone. Within that constraint, the stop can be located variously around the bobbin, the magnetic axis of the rotor need not pass through the projection 32, and the relative position of the magnetic axis of washer 34 can be altered accordingly. With an indicator scale covering approximately 180° of arc, and the crossover located at midscale, i.e., at approximately 90° of arc from the zero position, there is established a return-to-zero zone of about 90°. With a scale covering an arc greater than 180°, and the crossover retained at midscale, the return-to-zero zone will be enlarged accordingly. Obviously, with a scale of less than 180° the converse would be true. The orientation of the magnetic axis on rotor 17 is not limited to a plane passing through the projection 32. Moreover, the pointer can have any desired orientation relative to the magnetic axis of the rotor 17 so long as the relationships implicit in the described instrument are retained. Choice of N-S polarity is arbitrary, again, so long as the magnetic relationship between the secondary magnet and the rotor is maintained.

Having described the present invention with reference to the presently preferred embodiment thereof, it is to be understood that various changes in construction and operation can be incorporated without departing from the true spirit of the invention as defined in the appended claims.

What is claimed is:

1. An electrical indicator for providing analog readings as a function of signals furnished to sine and cosine windings, said indicator comprising in combination a permanently magnetized rotor disposed within the confines of a bobbin on and about which are disposed sine and cosine windings, a pointer operatively coupled to said rotor and rotatable with said rotor between a zero position and a maximum indicating position, a projection formed on said rotor, a stop member carried by said bobbin in the path of said rotor projection as said rotor rotates, said stop being located along with said pointer relative to said rotor projection such that said projection engages said stop when said pointer is at said zero position, and a second permanent magnet disposed in magnetically coupled relation to said rotor and in fixed position in said indicator for urging said rotor toward the pointer zero position against said stop whenever said pointer is within the first half of its full scale rotation when said sine and cosine windings are deenergized.

2. An electrical indicator according to claim 1, characterized in that said second permanent magnet is disposed within said bobbin with its magnetic axis rotated from the zero position location of the magnetic axis of said rotor through an arc substantially equal to one half of full scale rotation, and said pointer is approximately at mid-scale of said indicator when the magnetic axis of said rotor coincides with said magnetic axis of said second permanent magnet, and said indicator has an indicator scale that appears substantially linear to the casual observer.

3. An electrical indicator according to claim 2, characterized in that said indicator is constructed without field bucking compensation means, and said second permanent magnet has sufficiently low magnetic field strength that it does not significantly distort the indicator response over its entire scale range in spite of the absence of said field bucking compensation means.

4. An electrical indicator according to claim 1, characterized in that said bobbin includes a housing defining a right circular cylindrical chamber within which is mounted said rotor for rotation supported by a rotor shaft passing through the rotor body and journaled at its opposite ends in bores provided in the walls of said bobbin, and said second magnet is in the form of a washer of high coercivity magnetic material disposed against a circular end wall of said chamber with said rotor shaft passing therethrough, said washer being magnetized diametrally along a line making an angle with a line coinciding with the magnetic axis of said rotor when said rotor is in said zero position where said angle is less than that corresponding to full scale.

5. An electrical indicator according to claim 1, characterized in that said bobbin includes a housing defining a right circular cylindrical chamber within which is mounted said rotor for rotation supported by a rotor shaft passing through the rotor body and journaled at its opposite ends in the walls of said bobbin, said rotor is diameterally magnetized in a diametral plane, and said second magnet is disposed adjacent a circular end wall of said chamber magnetized to provide diametrally located opposite magnetic poles with the orientation of said magnetic poles rotated through an angle of about one half full scale from said magnetized rotor diametral plane when the pointer coupled to said rotor is at said zero position, the relative polarity of said magnetized poles to that of said rotor is such as to urge said rotor toward said zero position so long as said rotor is within less than said angle from said zero position.

6. An electrical indicator for providing analog readings as a function of signals furnished to sine and cosine windings, said indicator comprising in combination a permanently magnetized rotor disposed within the confines of a bobbin on and about which are disposed sine and cosine windings, a pointer operatively coupled to said rotor and rotatable with said rotor between a zero position and a maximum indicating position, a mechanical stop constructed and arranged to define said zero position and engage the rotor when said pointer reaches said zero position, and a second permanent magnet having opposite magnetic poles disposed in magnetically coupled relation to said rotor and in fixed position in said indicator, said poles being located relative to said bobbin for defining a return-to-zero zone equal to approximately one half the full scale of said indicator.

7. An electrical indicator according to claim 6, characterized in that said second permanent magnet is disposed within said bobbin with its magnetic axis rotated from the zero position location of the magnetic axis of said rotor through an arc substantially equal to one half of full scale rotation, and said pointer is approximately at mid-scale of said indicator when the magnetic axis of said rotor coincides with said magnetic axis of said second permanent magnet, and said indicator has an indicator scale that appears substantially linear to the casual observer.

8. An electrical indicator according to claim 7, characterized in that said indicator is constructed without field bucking compensation means, and said second permanent magnet has sufficiently low magnetic field strength that it does not significantly distort the indicator response over its entire scale range in spite of the absence of said field bucking compensation means.

9. An electrical indicator according to claim 6, characterised in that said indicator is constructed without field bucking compensation means, and said second permanent magnet has sufficiently low magnetic field strength that it does not significantly distort the indicator response over its entire scale range in spite of the absence of said field bucking compensation means.

10. An electrical indicator according to claim 1, characterized in that said indicator is constructed without field bucking compensation means, and said second permanent magnet has sufficiently low magnetic field strength that it does not significantly distort the indicator response over its entire scale range in spite of the absence of said field bucking compensation means.

11. An electrical indicator for providing analog readings as a function of signals furnished to sine and cosine windings, said indicator comprising in combination a permanently magnetized rotor disposed within the confines of a bobbin on and about which are disposed sine and cosine windings, a pointer operatively coupled to said rotor and rotatable with said rotor between a zero position and a maximum indicating position, a mechanical stop constructed and arranged to define said zero position and engage the rotor when said pointer reaches said zero position, and a second permanent magnet having opposite magnetic poles disposed in magnetically coupled relation to said rotor and in fixed position in said indicator, said poles being located relative to said bobbin for defining a return-to-zero zone equal to less-than the full scale of said indicator.

* * * * *